US006687320B1

(12) United States Patent
Chiu et al.

(10) Patent No.: US 6,687,320 B1
(45) Date of Patent: Feb. 3, 2004

(54) PHASE LOCK LOOP (PLL) CLOCK GENERATOR WITH PROGRAMMABLE SKEW AND FREQUENCY

(75) Inventors: You-Ming Chiu, Hsinchuang (TW); Jiin Lai, Taipei (TW); Jyhfong Lin, Taipei (TW); Hsin-Chieh Lin, Taipei (TW); Wei-Yu Wang, Taipei (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/322,072

(22) Filed: May 27, 1999

(30) Foreign Application Priority Data

Aug. 26, 1998 (TW) ....................................... 87114053 A

(51) Int. Cl.[7] .................................................. H03D 3/24

(52) U.S. Cl. ....................... 375/376; 375/356; 327/156; 713/500

(58) Field of Search ................................ 375/293, 294, 375/327, 354, 356, 371, 373, 376; 713/400, 401, 500, 503, 600; 370/503, 516, 517, 518; 405/260, 264, 265; 327/141, 147, 149, 152, 153, 155, 156, 161, 162, 163, 269, 270, 276

(56) References Cited

U.S. PATENT DOCUMENTS

| | | | | |
|---|---|---|---|---|
| 5,376,848 A | * | 12/1994 | Hanke et al. | 327/141 |
| 5,727,038 A | * | 3/1998 | May et al. | 375/376 |
| 5,857,095 A | * | 1/1999 | Jeddeloh et al. | 713/401 |
| 6,150,863 A | * | 11/2000 | Conn et al. | 327/270 |
| 6,289,068 B1 | * | 9/2001 | Hassoun et al. | 375/376 |

* cited by examiner

*Primary Examiner*—Chieh M. Fan
(74) *Attorney, Agent, or Firm*—J. C. Patents

(57) ABSTRACT

A phase lock loop (PLL) clock generator with programmable frequency and skew is provided in the present invention, in which frequency of clock signals generated can be dynamically changed and skew of the clock signals generated can be dynamically adjusted by a computer program. Also, the signal skew due to the change of loading can be compensated. Therefore, the PLL clock generator based on a closed-loop configuration can better control the skew of clock signals to provide higher stability and durability to the system.

6 Claims, 4 Drawing Sheets

PHASE LOCK LOOP (PLL) CLOCK GENERATOR WITH PROGRAMMABLE SKEW AND FREQUENCY

CROSS-REFERENCE TO RELATED APPLICATION

This application claims the priority benefit of Taiwan application serial no. 87114053, filed Aug. 26, 1998, the full disclosure of which is incorporated herein by reference.

BACKGROUND OF THE INVENTION

1. Field of the Invention

The present invention generally relates to a clock generator, and more particularly to a phase lock loop (PLL) clock generator with programmable skew and frequency.

2. Description of the Related Art

With the advancement of semiconductor technologies, operating frequency of digital circuit systems is getting higher and higher. Therefore, the problem of clock synchronization becomes an important issue for designers. The clock synchronization involves not only a single clock signal, but also multiple clock signals. Generally, skew of a clock signal is determined by the clock generator and the loading based on an open-loop configuration. When trace length from the clock generator to the loading becomes longer, or the loading increases, the problem of signal skew of the clock signals becomes more serious. For example, many devices might share a single clock generator on a computer motherboard. Also, memory size can be dynamically changed depending on user requirements. Furthermore, there are many interface slots for connecting peripheral devices depending on practical requirements. Therefore, the change of memory size and quantity of peripheral devices will accordingly change the loading on the clock signal. It is no wonder that the open-loop configuration can not solve the problem of signal skew. On the other hand, there is a need to change the frequency of a clock signal. If all the clock signals are provided by external clock generators, it is difficult to arbitrarily change the clock frequency because the frequency of the clock signals has been fixed.

FIG. 1 is a schematic block diagram of a computer motherboard using a conventional clock generator, in which a single clock generator 150 provides clock signals CPU_CLK and SYS_CLK. The clock signal CPU_CLK provides signals to a CPU 110 and a chipset 120, while the clock signal SYS_CLK provides signals to the chipset 120 and devices 141 to 14N through a bus 130. Since the chipset 120 is responsible for controlling operations of the computer motherboard, it needs to reference both the clock signal SYS_CLK and the clock signal CPU_CLK. The devices 141 to 14N are peripheral devices. Since various numbers of peripheral devices can be connected to the computer motherboard, the loading on the clock signal SYS_CLK is therefore varied depending on the number of devices connected. The change of loading on the clock signal SYS_CLK affects the skew of the clock signal, and consequently the stability of the whole system.

If multiple clock signals can be provided from the chipset 120 to devices within the system, designers can better control the skew of clock signals to provide higher stability and durability to the system. Furthermore, frequency of the clock signals can be dynamically changed by a computer program.

As a summary, the conventional clock generator has the following sadvantages:

1. If clock signals are provided by external clock generators, the frequency of the clock signals can not be easily changed, particularly by a computer program.
2. The clock signal provided based on an open-loop configuration is affected by the change of loading, which imposes great difficulty to control the skew of the clock signal, and consequently the stability of the system.

SUMMARY OF THE INVENTION

It is therefore an objective of the present invention to provide a phase lock loop (PLL) clock generator with programmable frequency to dynamically change the clock frequency generated.

It is another objective of the present invention to provide a PLL clock generator with programmable skew so that the skew of the clock signal can be dynamically adjusted.

In accordance with the foregoing and other objectives of the present invention, a phase lock loop (PLL) clock generator with programmable frequency and skew is provided, in which a clock signal is generated based on a reference signal. The clock generator includes a plurality of first delay devices each having a first terminal and a second terminal, a first multiplexer, a plurality of second delay devices each having a first terminal and a second terminal, a second multiplexer, and a PLL signal generator.

The first delay devices are cascaded in series by connecting the second terminal of a first delay device to the first terminal of an adjacent first delay device. The first terminal of one of the first delay devices is coupled to the reference signal.

The first multiplexer comprises a plurality of input terminals, an output terminal, and a first selection input. The input terminals of the first multiplexer are connected to the reference signal and the second terminals of the first delay devices, respectively, so that one of the input signals to the first multiplexer is chosen by the first selection input to couple to the output terminal of the first multiplexer.

The second delay devices are cascaded in series by connecting the second terminal of a second delay device to the first terminal of an adjacent second delay device. The first terminal of one of the second delay devices is coupled to a feedback signal.

The second multiplexer comprises a plurality of input terminals, an output terminal, and a second selection input. The input terminals of the second multiplexer are connected to the feedback signal and the second terminals of the second delay devices, respectively, so that one of the input signals to the second multiplexer is chosen by the second selection input to couple to the output terminal of the second multiplexer.

The PLL signal generator comprises a first input terminal, a second input terminal, and an output terminal. The first input terminal of the PLL signal generator is coupled to the output terminal of the first multiplexer and the second input terminal of the PLL signal generator is coupled to the output terminal of the second multiplexer. The clock signal is generated from the output terminal of the PLL signal generator and fed back to serve as the feedback signal via a conductive line.

According to a preferred embodiment of the present invention, the clock signal, which is fed back at the midpoint of the conductive line to serve as the feedback signal, provides clock signals required by external devices.

The above-mentioned PLL signal generator in the PLL clock generator comprises a plurality of first dividers each having an input terminal and an output terminal, a third multiplexer, a plurality of second dividers each having an input terminal and an output terminal, a fourth multiplexer, a PLL core circuit, a plurality of third dividers each having an input terminal and an output terminal, and a fifth multiplexer.

The input terminals of the first dividers are connected to the output terminal of the first multiplexer.

The third multiplexer comprise a plurality of input terminals, an output terminal, and a third selection input. The input terminals of the third multiplexer are connected to the output terminals of the first dividers, respectively, so that one of the input signals to the third multiplexer is chosen by the third selection input to couple to the output terminal of the third multiplexer.

The input terminals of the second dividers are connected to the output terminal of the second multiplexer.

The fourth multiplexer comprises a plurality of input terminals, an output terminal, and a fourth selection input. The input terminals of the fourth multiplexer are connected to the output terminals of the second dividers, respectively, so that one of the input signals to the fourth multiplexer is chosen by the fourth selection input to couple to the output terminal of the fourth multiplexer.

The PLL core circuit comprises a reference input terminal, a feedback input terminal, and an output terminal. The PLL core circuit generates a signal at the output terminal based on the phase difference between signals at the reference input terminal and the feedback input terminal. The reference input terminal is coupled to the output terminal of the third multiplexer and the feedback input terminal is coupled to the output terminal of the fourth multiplexer.

The input terminals of the third dividers are connected to the output terminal of the PLL core circuit.

The fifth multiplexer comprises a plurality of input terminals and an output terminal. The input terminals of the fifth multiplexer are connected to the output terminals of the third dividers, respectively, and the clock signal is produced from the output terminal of the fifth multiplexer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
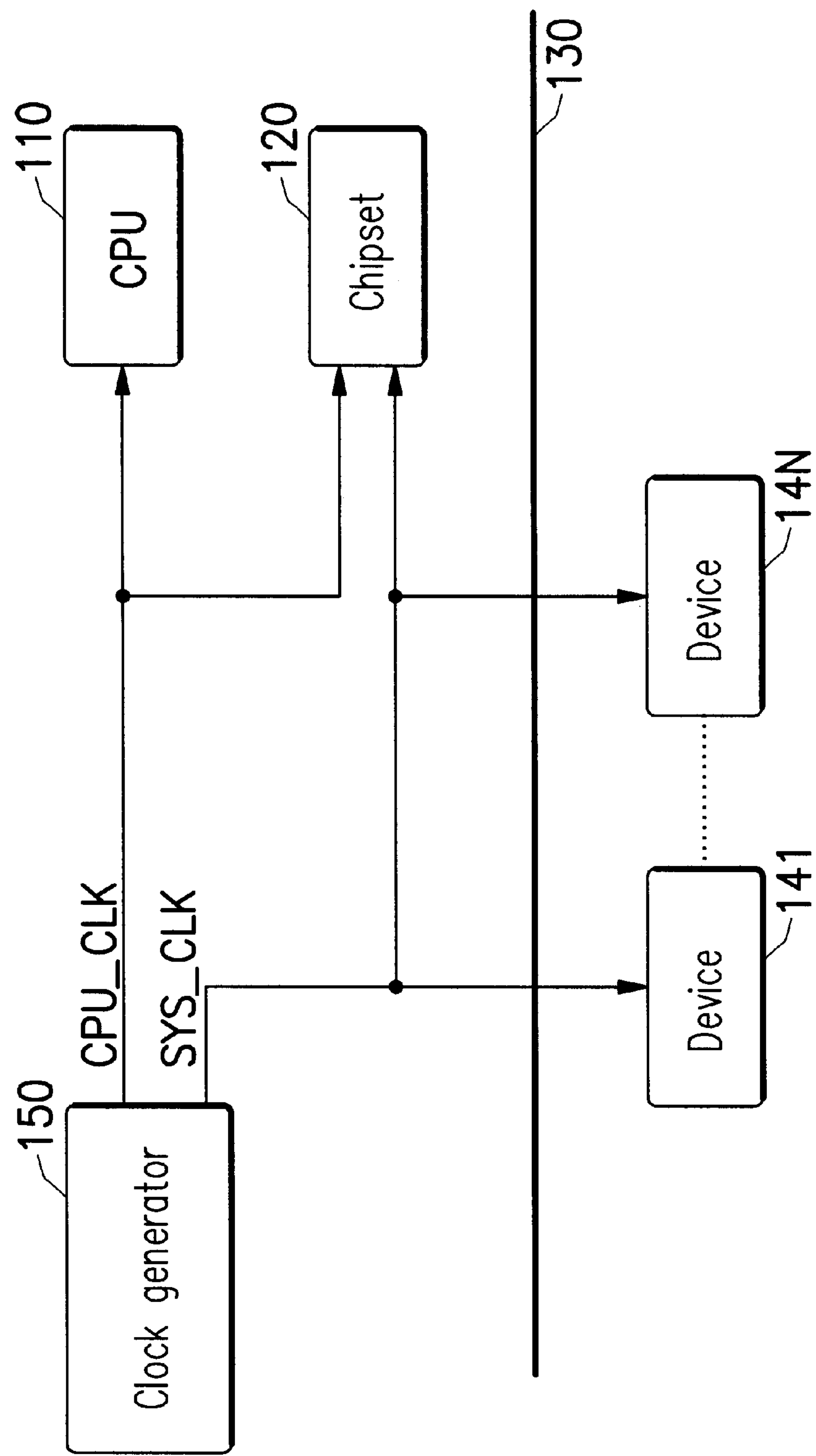
FIG. 1 is a schematic block diagram of a computer motherboard using a conventional clock generator.

Reference will now be made in detail to the present preferred embodiments of the invention, examples of which are illustrated in the accompanying drawings. Wherever possible, the same reference numbers are used in the drawings and the description to refer to the same or like parts.

Figure 2:
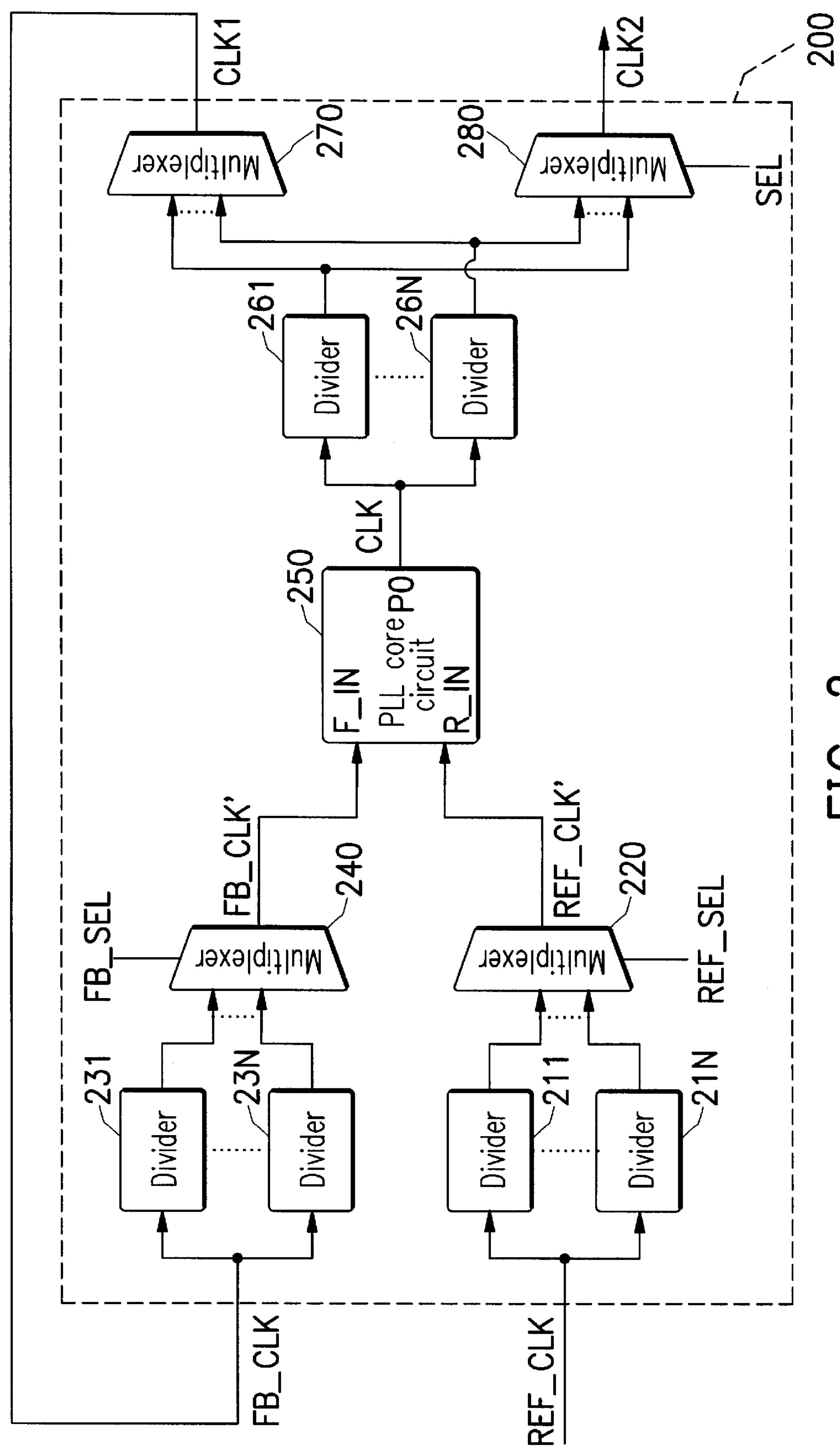
FIG. 2 is a block diagram of a phase lock loop (PLL) signal generator with programmable frequency according to a preferred embodiment of the present invention.

FIG. 2 is a block diagram of a phase lock loop (PLL) signal generator 200 with programmable frequency according to a preferred embodiment of the present invention. As shown in FIG. 2, the PLL signal generator 200 generates a clock signal CLK2 with a changeable frequency based on a reference signal REF_CLK. The PLL signal generator 200 comprises dividers 211 to 21 N, a multiplexer 220, dividers 231 to 23N, a multiplexer 240, a PLL core circuit 250, dividers 261 to 26N, a multiplexer 270, and a multiplexer 280.

The reference signal REF_CLK is connected to input terminals of the dividers 211 to 21N, which divide the frequency of the reference signal REF_CLK by different numbers to obtain signals with different frequencies as their outputs. The output signals from the dividers 211 to 21N are then connected to input terminals of the multiplexer 220 which is controlled by a selection input REF_SEL so that one of the inputs to the multiplexer 220 is chosen as the output signal REF_CLK'. The ratio between the reference signal REF_CLK and the output signal REF_CLK' from the multiplexer 220 can be determined by the selection input REF_SEL.

A feedback signal FB_CLK is connected to input terminals of the dividers 231 to 23N, which divide the frequency of the feedback signal FB_CLK by different numbers to obtain signals with different frequencies as their outputs. The output signals from the dividers 231 to 23N are then connected to input terminals of the multiplexer 240 which is controlled by a selection input FB_SEL so that one of the inputs to the multiplexer 240 is chosen as the output signal FB_CLK'. The ratio between the feedback signal FB_CLK and the output signal FB_CLK' from the multiplexer 240 can be determined by the selection input FB_SEL.

The PLL core circuit 250 is responsible for achieving the main functions of the PLL signal generator 200, including a reference input terminal R_IN coupled to the output signal REF_CLK' from the multiplexer 220, a feedback input terminal F_IN coupled to the output signal FB_CLK' from the multiplexer 240, and an output terminal PO to produce an output signal CLK. The PLL core circuit 250 can adjust the frequency and phase of the output signal CLK based on the phase difference between the output signal REF_CLK' from multiplexer 220 and the output signal FB_CLK' from multiplexer 240 so that the phase difference between the signal REF_CLK' and signal FB_CLK' can be minimized.

The output signal CLK from the output terminal PO of the PLL core circuit 250 is connected to input terminals of dividers 261 to 26N, which divide the frequency of the signal CLK by different numbers to obtain signals with different frequencies as their outputs. The output signals from the dividers 261 to 26N are coupled to input terminals of both the multiplexer 270 and multiplexer 280. One of the inputs to the multiplexer 280 which is controlled by a selection input SEL is chosen as the output clock signal CLK2 required by external circuits.

The multiplexer 270 generates an output signal CLK1 which serves as the feedback signal FB_CLK. The feedback signal FB_CLK then goes to the feedback input terminal F_IN of the PLL core circuit 250 through the dividers 231 to 23N and the multiplexer 240 to form a closed phase lock loop. The use of the multiplexer 270 is not for selecting a frequency for the feedback signal FB_CLK. Instead, it is used to make the time delay between the signals CLK1 and CLK2 more consistent to better control the skew of clock signals.

Based on the above-mentioned PLL signal generator 200, it is understood that a clock signal CLK2 with desired frequency can be generated by choosing the selection inputs REF_SEL, FB_SEL, and SEL based on the reference signal REF_CLK. Assume the reference signal REF_CLK has a frequency $f_r$, the ratio between the reference signal REF_CLK and the signal REF_CLK' is N determined by the selection input REF_SEL, the ratio between the feedback signal FB_CLK and the signal FB_CLK' is D determined by the selection input FB_SEL, and the ratio between the signals CLK and CLK1 is fixed at 1. Therefore, the signal CLK generated by the PLL signal generator 200 has a frequency of $f_r$*N/D. The multiplexer 280 is used to select the clock signal CLK2 with a desired frequency. More multiplexers can be used to provide clock signals with various frequencies required by different kinds of circuits.

Figure 3:
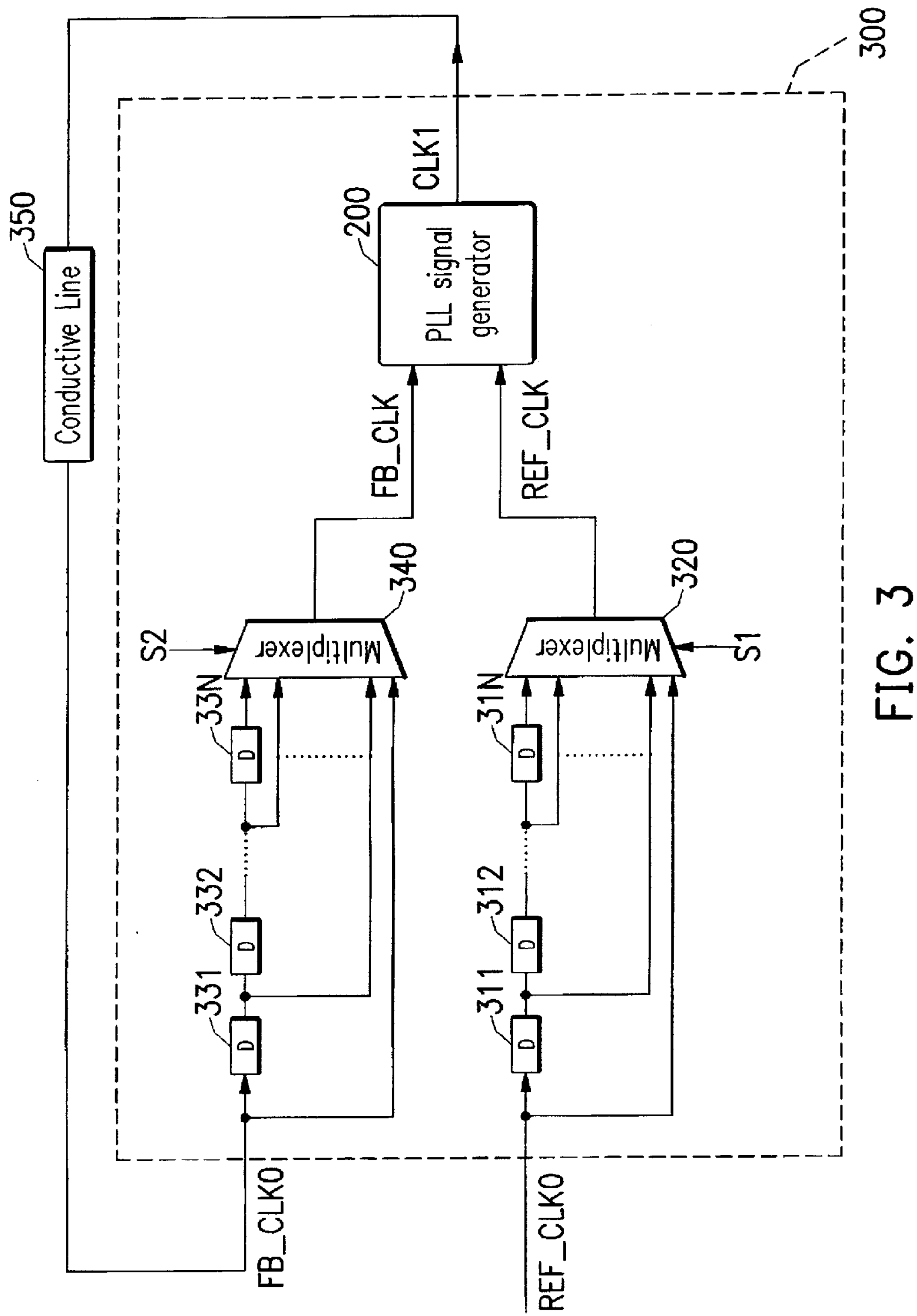
FIG. 3 is a block diagram of a phase lock loop (PLL) clock generator with programmable frequency and skew.

Based on the above-mentioned PLL signal generator 200, the skew of clock signals can be better controlled, which is described in details hereinafter:

FIG. 3 is a block diagram of a phase lock loop (PLL) clock generator 300 with programmable frequency and skew. The PLL clock generator 300 generates a clock signal CLK1 required by external circuits based on a reference signal REF_CLK0. As shown in FIG. 3, the PLL clock generator 300 comprises delay devices 311 to 3 IN, a multiplexer 320, delay devices 331 to 33N, a multiplexer 340, and, a PLL signal generator 200. The delay devices 311 to 31N are cascaded in series. The reference signal REF_CLK0 is coupled to the input terminal of the first delay device 311. The multiplexer 320 comprises a plurality of input terminals, an output terminal, and a selection input. The input terminals of the multiplexer 320 are coupled to the reference signal REF_CLK0 and outputs of the delay devices 311 to 31N, respectively. The multiplexer 320 is controlled by the selection input S1 in such a way that one of the inputs of the multiplexer 320 is selected as the output signal REF_CLK which is then coupled to the PLL signal generator 200.

Similarly, the delay devices 331 to 33N are cascaded in series. The feedback signal FB_CLK0 is coupled to the input terminal of the first delay device 331. The multiplexer 340 comprises a plurality of input terminals, an output terminal, and a selection input. The input terminals of the multiplexer 340 are coupled to the feedback signal FB_CLK0 and outputs of the delay devices 311 to 31N, respectively. The multiplexer 340 is controlled by the selection input S2 in such a way that one of the input terminals of the multiplexer 340 is selected as the output signal FB_CLK which is then coupled to the PLL signal generator 200.

The PLL signal generator 200 in FIG. 3 is shown in FIG. 2, including a reference input terminal, a feedback input terminal, and an output terminal. The reference input terminal of the PLL signal generator 200 is coupled to the signal REF_CLK from the output terminal of the multiplexer 320, while feedback input terminal of the PLL signal generator 200 is coupled to the signal FB_CLK from the output terminal of the multiplexer 340. The clock signal CLK1 is generated by the PLL signal generator 200, which serves as the feedback signal FB_CLK0 via a conductive line 350. As shown in FIG. 2, the PLL core circuit 250 in the PLL signal generator 200 can adjust the frequency and phase of the output signal CLK based on the phase difference between the signal REF_CLK' and the signal FB_CLK' so as to minimize the phase difference between the signal REF_CLK' and signal FB_CLK'. Thus, the PLL signal generator 200 can generate the clock signal CLK1 based on the relationship between the reference signal REF_CLK and the feedback signal FB_CLK.

To take into account of the signal delay caused by the trace length so as to better control the signal skew, the clock signal CLK1 is fed back and serves as the feedback signal FB_CLK0 via a conductive line 350.

Accordingly, the PLL clock generator 300 is controlled by the selection inputs S1 and S2 and adjusted by the delay devices 311 to 31N between the reference signal REF_CLK0 and the signal REF_CLK as well as the delay devices 331 to 33N between the feedback signal FB_CLK0 and the signal FB_CLK so that the skew of the clock signal CLK1 can be controllably minimized.

Figure 4:
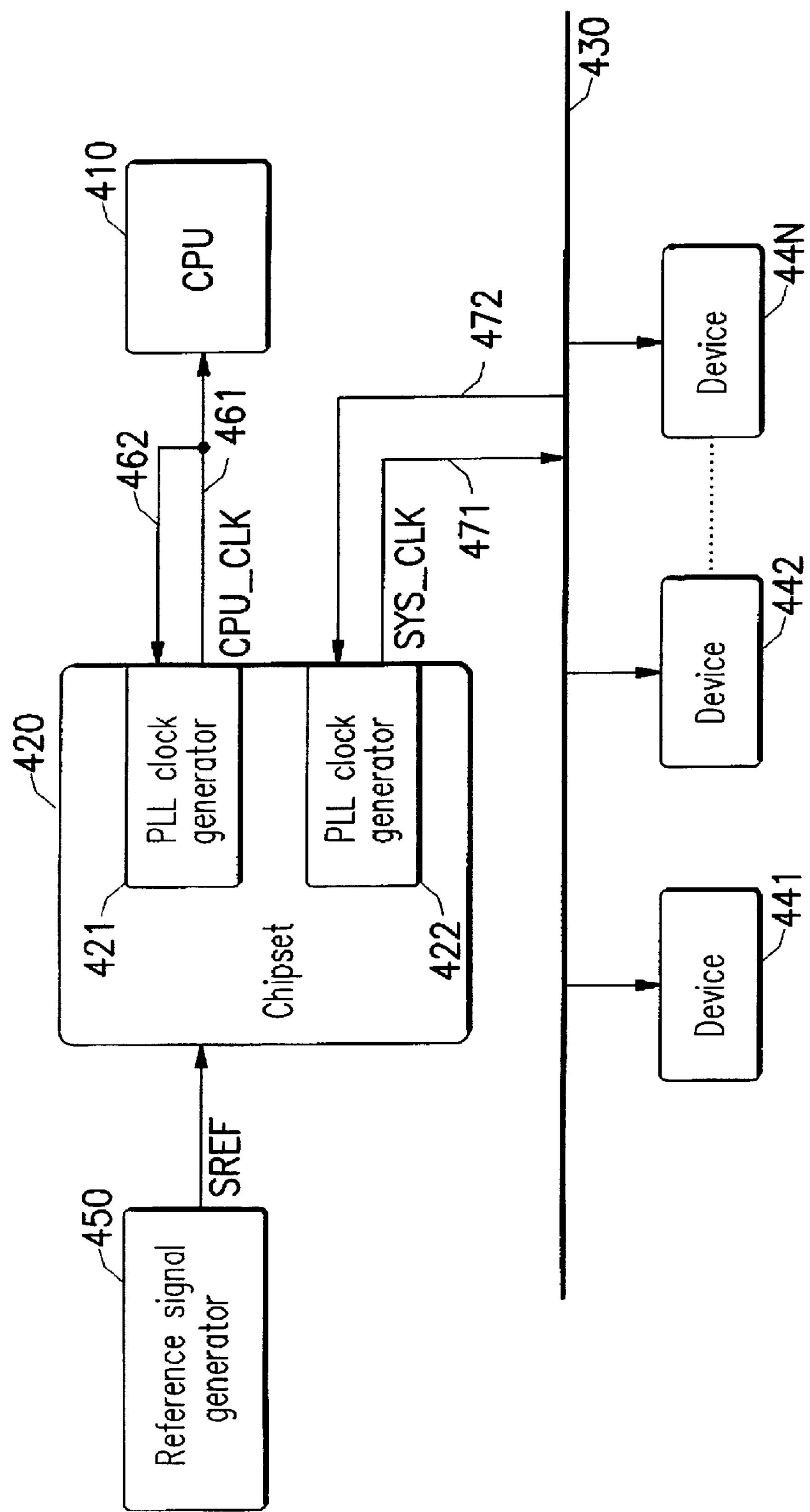
FIG. 4 is a schematic block diagram of a computer motherboard using the phase lock loop (PLL) clock generator.

FIG. 4 is a schematic block diagram of a computer motherboard using the phase lock loop (PLL) clock generator. As shown in FIG. 4, a chipset 420 comprises PLL clock generators 421 and 422. The PLL clock generator 421 generate a clock signal CPU_CLK to a CPU 410 and the PLL clock generator 422 generates a clock signal SYS_CLK to devices 441 to 44N through a bus 430, based on a reference signal SREF from a reference signal generator 450. The PLL clock generators 421 and 422, which have a structure as shown in FIG. 3, produce the clock signals CPU_CLK and SYS_CLK based on the reference signal SREF from the reference signal generator 450. The frequency and skew of the clock signals CPU_CLK and SYS_CLK generated from the PLL clock generators 421 and 422 can be adjusted separately so that the clock signals with a desired frequency can be obtained and the skew between the clock signals CPU_CLK and SYS_CLK can be minimized. To reflect the loading on the devices, a feedback signal is taken at the midpoint of the trace length from output of the PLL clock generator to the devices, so that the skew between the feedback signal and the clock signal to the devices can be maintained the same. For example, the clock signal CPU_CLK is provided to the CPU 410 via a conductive line 461. A feedback signal is taken at the midpoint of conductive line 461 and coupled to the PLL clock generator 421 via a conductive line 462. Similarly, the clock signal SYS_CLK is coupled to the bus 430 via a conductive line 471. A feedback signal is taken at an appropriate position on the bus 430 and coupled to the PLL clock generator 422 via a conductive line 472.

Based on the above-mentioned computer motherboard, the frequency of the clock signal CPU_CLK sent to the CPU 410 and the clock signal SYS_CLK sent to the devices 441 to 44N can be adjusted based on the operating speed of the CPU 410 and the devices 441 to 44N. The skew of clock signal CPU_CLK can be adjusted depending on the actual distance between the CPU 410 and the chipset 420. Furthermore, the skew of clock signal SYS_CLK can also be adjusted depending on the actual loading on the bus 430 or the device numbers connected to the bus 430. Therefore, the skew of clock signals sent to the CPU 410 and the devices 441 to 44N can be minimized.

Therefore, the PLL clock generators within a chipset on a computer motherboard according to the preferred embodiment of the present invention can provide clock signals required by the system. Furthermore, the skew of clock signals can be better controlled through the closed-loop configuration of the PLL clock generator. The skew of clock signals can also be adjusted by a computer program based on actual requirements. For example, if more memories or interface cards are installed, which consequently increase the actual loading and the skew of the clock signals, then delay time of signals from the reference input can be increased to compensate the skew of the clock signals. No manual operation by users to change settings of the jumpers on the motherboard is required. On the contrary, the loading imposed on the clock signals can be automatically detected by the basic input and output system (BIOS) programs so that the skew settings can be automatically adjusted.

As a summary, the PLL clock generator with programmable frequency and skew according to the preferred embodiments of the present invention has the following advantages:

1. The frequency of clock signals generated by the PLL clock generator can be dynamically changed by a computer program.
2. The skew of clock signals generated by the PLL clock generator can be dynamically adjusted by a computer program, so that the skew of clock signals can be better controlled.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase lock loop (PLL) signal generator with programmable frequency to generate a clock signal based on a reference signal, the PLL signal generator comprising:

a plurality of first dividers each having an input terminal and an output terminal, wherein the input terminals of the first dividers arc connected to the reference signal;

a first multiplexer having a plurality of input terminals, an output terminal, and a first selection input, wherein the input terminals of the first multiplexer are connected to the output terminals of the first dividers, respectively, so that one of the input signals to the first multiplexer is chosen by the first selection input to couple to the output terminal of the first multiplexer;

a plurality of second dividers each having an input terminal and an output terminal, wherein the input terminals of the second dividers are connected to a feedback signal;

a second multiplexer having a plurality of input terminals, an output terminal, and a second selection input, wherein the input terminals of the second multiplexer are connected to the output terminals of the second dividers, respectively, so that one of the input signals to the second multiplexer is chosen by the second selection input to couple to the output terminal of the second multiplexer;

a PLL core circuit having a reference input terminal, a feedback input terminal, and an output terminal, wherein the reference input terminal is coupled to the output terminal of the first multiplexer and the feedback input terminal is coupled to the output terminal of the second multiplexer, wherein the PLL core circuit generates an output signal based on the phase difference between signals at the reference input terminal and the feedback input terminal;

a plurality of third dividers each having an input terminal and an output terminal, wherein the input terminals of the third dividers are connected to the output terminal of the PLL core circuit;

a third multiplexer having a plurality of input terminals and an output terminal, wherein the input terminals of the third multiplexer are connected to the output terminals of the third dividers, respectively, and a signal produced from the output terminal of the third multiplexer serves as the feedback signal; and a fourth multiplexer having a plurality of input terminals, an output terminal, and a third selection input, wherein the input terminals of the fourth multiplexer are connected to the output terminals of the third dividers, respectively, so that one of the input signals to the fourth multiplexer is chosen by the third selection input to produce the clock signal from the output terminal of the fourth multiplexer.

2. A phase lock loop (PLL) clock generator with programmable frequency and skew to generate a clock signal based on a reference signal, the PLL clock generator comprising:

a plurality of first delay devices each having a first terminal and a second terminal, wherein the first delay devices are cascaded in series by connecting the second terminal of a first delay device to the first terminal of an adjacent first delay device, wherein the first terminal of one of the first delay devices is coupled to the reference signal;

a first multiplexer having a plurality of input terminals, an output terminal, and a first selection input, wherein the input terminals of the first multiplexer are connected to the reference signal and the second terminals of the first delay devices, respectively, so that one of the input signals to the first multiplexer is chosen by the first selection input to couple to the output terminal of the first multiplexer;

a plurality of second delay devices each having a first terminal and a second terminal, wherein the second delay devices are cascaded in series by connecting the second terminal of a second delay device to the first terminal of an adjacent second delay device, wherein the first terminal of one of the second delay devices is coupled to a feedback signal;

a second multiplexer having a plurality of input terminals, an output terminal, and a second selection input, wherein the input terminals of the second multiplexer are connected to the feedback signal and the second terminals of the second delay devices, respectively, so that one of the input signals to the second multiplexer is chosen by the second selection input to couple to the output terminal of the second multiplexer; and a PLL signal generator having a first input terminal, a second input terminal, and an output terminal, wherein the first input terminal of the PLL signal generator is coupled to the output terminal of the first multiplexer and the second input terminal of the PLL signal generator is coupled to the output terminal of the second multiplexer, wherein the clock signal required by external devices is generated from the output terminal of the PLL signal generator and the clock signal is fed back to serve as the feedback signal via a conductive line.

3. The PLL clock generator with programmable frequency and skew of claim 2, wherein the clock signal at the midpoint of the conductive line is fed back to serve as the feedback signal.

4. The PLL clock generator with programmable frequency and skew of claim 2, wherein the PLL signal generator comprises:

a plurality of first dividers each having an input terminal and an output terminal, wherein the input terminals of the first dividers are connected to the output terminal of the first multiplexer;

a third multiplexer having a plurality of input terminals, an output terminal, and a third selection input, wherein the input terminals of the third multiplexer are connected to the output terminals of the first dividers, respectively, so that one of the input signals to the third multiplexer is chosen by the third selection input to couple to the output terminal of the third multiplexer;

a plurality of second dividers each having an input terminal and an output terminal, wherein the input terminals of the second dividers are connected to the output terminal of the second multiplexer;

a fourth multiplexer having a plurality of input terminals, an output terminal, and a fourth selection input, wherein the input terminals of the fourth multiplexer are connected to the output terminals of the second dividers respectively, so that one of the input signals to the fourth multiplexer is chosen by the fourth selection input to couple to the output terminal of the fourth multiplexer;

a PLL core circuit having a reference input terminal, a feedback input terminal, and an output terminal, wherein the reference input terminal is coupled to the output terminal of the third multiplexer and the feedback input terminal is coupled to the output terminal of the fourth multiplexer, wherein the PLL core circuit generates an output signal based on the phase difference between signals at the reference input terminal and the feedback input terminal;

a plurality of third dividers each having an input terminal and an output terminal, wherein the input terminals of the third dividers are connected to the output terminal of the PLL core circuit; and a fifth multiplexer having a plurality of input terminals and an output terminal, wherein the input terminals of the fifth multiplexer are connected to the output terminals of the third dividers, respectively, and the clock signal is generated from the output terminal of the fifth multiplexer.

5. A phase lock loop (PLL) clock generator with programmable skew to generate a clock signal based on a reference signal, the PLL clock generator comprising:

a plurality of first delay devices each having a first terminal and a second terminal, wherein the first delay devices are cascaded in series by connecting the second terminal of a first delay device to the first terminal of an adjacent first delay device, wherein the first terminal of one of the first delay devices is coupled to the reference signal;

a first multiplexer having a plurality of input terminals, an output terminal, and a first selection input, wherein the input terminals of the first multiplexer are connected to the reference signal and the second terminals of the first delay devices, respectively, so that one of the input signals to the first multiplexer is chosen by the first selection input to couple to the output terminal of the first multiplexer;

a plurality of second delay devices each having a first terminal and a second terminal, wherein the second delay devices are cascaded in series by connecting the second terminal of a second delay device to the first terminal of an adjacent second delay device, wherein the first terminal of one of the second delay devices is coupled to a feedback signal;

a second multiplexer having a plurality of input terminals, an output terminal, and a second selection input, wherein the input terminals of the second multiplexer are connected to the feedback signal and the second terminals of the second delay devices, respectively, so that one of the input signals to the second multiplexer is chosen by the second selection input to couple to the output terminal of the second multiplexer; and a PLL signal generator having a first input terminal, a second input terminal, and an output terminal, wherein the first input terminal of the PLL signal generator is coupled to the output terminal of the first multiplexer and the second input terminal of the PLL signal generator is coupled to the output terminal of the second multiplexer, wherein the clock signal required by external devices is generated from the output terminal of the PLL signal generator based on a relationship between the first input terminal and second input terminal of the PLL signal generator, wherein the clock signal is fed back to serve as the feedback signal via a conductive line.

6. The PLL clock generator with programmable skew of claim 5, wherein the clock signal at the midpoint of the conductive line is fed back to serve as the feedback signal.

* * * * *